United States Patent [19]
Naya

[11] Patent Number: 6,077,765
[45] Date of Patent: Jun. 20, 2000

[54] STRUCTURE OF BUMP ELECTRODE AND METHOD OF FORMING THE SAME

[75] Inventor: Kinichi Naya, Hamura, Japan

[73] Assignee: Casio Computer Co., Ltd., Tokyo, Japan

[21] Appl. No.: 08/946,775

[22] Filed: Oct. 8, 1997

[30] Foreign Application Priority Data

Oct. 16, 1996 [JP] Japan .................................. 8-293157

[51] Int. Cl.⁷ .................................................. H01L 21/44
[52] U.S. Cl. ........................ 438/614; 438/613; 438/951; 438/670
[58] Field of Search ................................. 438/613, 614, 438/946, 951, 725, 678, 670

[56] References Cited

U.S. PATENT DOCUMENTS 5,251,806  10/1993  Agarwala et al. .
5,808,853   9/1998  Dalal et al. ............................ 361/306.1

FOREIGN PATENT DOCUMENTS 6-112274  4/1994  Japan .

Primary Examiner—Caridad Everhart
Attorney, Agent, or Firm—Frishauf, Holtz, Goodman, Langer & Chick, P.C.

[57] ABSTRACT

A method of forming a bump electrode, comprises the steps of preparing an Si-substrate having a plurality of bonding pads, forming a core on a substantially central portion of the bonding pad on the substrate, forming a resist layer around the core, which has a greater plan-view shape than the core and is provided with an opening portion through which that portion of the bonding pad, which is located around the core, is exposed, and coating an electric conduction strip having a uniform thickness on peripheral and upper surfaces of the core and on that portion of the bonding pad, which is located around the core, by a plating method.

12 Claims, 9 Drawing Sheets

STRUCTURE OF BUMP ELECTRODE AND METHOD OF FORMING THE SAME

BACKGROUND OF THE INVENTION

The present invention relates to a method of forming a columnar bump electrode for bonding, on an external connection pad provided on a semiconductor substrate.

A wire bonding (WB) method is generally known as a method for connecting a bonding pad on a semiconductor circuit chip (e.g. LSI chip) and a terminal on a print wiring board (PWB). According to the WB method, metal wires of Au, Cu, Al, etc. with a diameter of 25 to 30 $\mu m \phi$ are used one by one in order to successively connect the bonding pads of the LSI chip and the connection terminals on the print wiring board by means of thermal compression bonding or ultrasonic bonding. The WB method is now most widely used as a connecting method.

However, the WB (wiring bonding) method has problems in that it cannot cope with recent development in integration density of semiconductor integrated circuits, an increase in number of pins due to higher operation speed, a decrease in pitch of bonding pads, or mounting of thinner semiconductor devices at higher density.

Under the circumstances, attention has been paid to a TAB (Tape Automated Bonding) method and an FCB (Flip Chip Bonding) method as methods of connecting LSI chips, which are capable of coping with gang bonding, a decrease in pitch of bonding pads, and mounting of thinner semiconductor devices at higher density. In particular, the FCB method, which requires a least mounting area, is adopted in manufacturing consumer products.

In the FCB method, electrodes called bumps are formed on bonding pads of LSI chips. There are two types of bumps: melt-type bumps formed of solder, etc. with a height of 80 to 150 $\mu m$ on bonding pads arranged at a bonding pad pitch of 150 to 250 $\mu m$; and non-melt type bumps formed of Au, etc. with a height of 20 to 25 $\mu m$ on bonding pads arranged at a bonding pad pitch of 150 $\mu m$ or less.

In consideration of consumer products to be manufactured in the future, it is expected that non-melt type solder bumps will prevail over melt-type solder bumps since most of LSI chips have peripheral-type bonding pad array having a bonding pad pitch of 150 $\mu m$ or less according to WB specifications.

In the case of consumer products, organic boards are generally used. When an LSI chip is to be directly bonded to an organic substrate by the FCB (Flip Chip Bonding) method, a thermal stress due to a difference in thermal expansion coefficient between the print wiring board (PWB) and the LSI chip is entirely applied to the connection portions.

As a result, there is a problem with the reliability of the connection portions when conventional non-melt type bumps with a height of 20 to 25 $\mu m$. In order to solve this problem, there is a method of increasing the height of the connection portion between the print wiring board and the LSI chip. In order to carry out this method, a bump electrode with a height of 30 $\mu m$ or more needs to be used. In the prior art, a bump electrode with a height of 30 $\mu m$ or more has been formed by two methods: a method of using a resist layer with a thickness of 30 $\mu m$ or less, which is adopted in forming an Au bump; and a method of using a resist layer of 30 $\mu m$ or more. The conventional bump electrode may be formed by the steps illustrated in FIGS. 13 to 17.

At first, as shown in FIG. 13, a bonding pad 2 formed of, e.g. aluminum is formed on a silicon substrate 1. A passivation layer 3 formed of silicon oxide or silicon nitride is provided so as to cover the surface of the substrate 1 and that portion of the upper surface of the bonding pad 2, which excludes a central portion of the upper surface of the bonding pad 2. The central portion of the bonding pad 2 is exposed through an opening portion 4.

Subsequently, as shown in FIG. 14, an under-bump metallurgy (UBM) layer 5 is formed on the entire upper surface of the resultant structure, and a resist layer 6 with a thickness of 1 to 30 $\mu m$ is formed. An opening portion 7 is formed in the resist layer 6 in a position corresponding to the bonding pad 2. A bump electrode 8 is formed to a height of, e.g. 60 $\mu m$ by means of electroplating, with the UBM layer 5 being used as a plating current path. Thus, the bump electrode 8, as shown in FIG. 14, is formed.

In the above-described method, the height of the bump is set at 60 $\mu m$, and the thickness of the resist layer 6 is at 1 to 30 $\mu m$. Thus, the bump electrode 8 has a horizontal growth portion from the resist opening portion 7 (i.e. a growth portion from the resist opening portion 7) at each side, which is 30 to 59 $\mu m$ long. Then, the resist layer 6 is removed and, with the bump electrode 8 used as a mask, an exposure portion of the UBM layer 5 is removed by a wet etching method or a dry etching method. Thus, a mushroom-shaped bump electrode 8 is obtained, as shown in FIG. 15.

In this method of forming the bump electrode, if the height of the bump electrode 8 is increased, the horizontal extension of thereof is also increased. Accordingly, in order to prevent a short-circuit between adjacent bump electrodes 8, it is necessary to increase a bonding pad pitch. As a result, it is difficult to decrease the bonding pad pitch. In order to solve this problem, there is a method of forming a bump electrode by using a thick resist. In this method, the bump electrode is formed by the steps illustrated in FIGS. 13, 16 and 17. The step illustrated in FIG. 13 has already been described.

As is shown in FIG. 16, a resist layer 9 comprising two resist films 9a and 9b or a single resist film (not shown) is formed. An opening portion 11 is formed in the resist layer 9 in a position corresponding to the bonding pad 2.

Subsequently, electroplating is performed, with the UBM layer 5 being used as a current path, thereby filling the inside of the opening portion 11 with gold, etc. Thus, a column bump electrode 12 is formed.

Then, the resist layer 9 is removed and, with the bump electrode 12 used as a mask, an exposure portion of the UBM layer 5 is etched away by a wet etching method or a dry etching method. Thus, the column bump electrode 12 with a height of 30 $\mu m$ or more is formed, as shown in FIG. 17.

In the above method, when the thick resist layer is formed of a liquid type resist, the limit value of the thickness thereof is 60 to 70 $\mu m$ in consideration of the current coating techniques and resist material characteristics. The distribution in film thickness indicates that the resist layer is formed in a concave lens shape. Consequently, the thickness of the resist layer is non-uniform, and uniform exposure cannot be achieved. For these reasons, the bump electrode cannot be formed with high accuracy. Moreover, the material of the resist is very expensive, and the efficiency of use of resist material is low. As a result, the cost for forming the bump electrode is high.

Furthermore, when a thick resist layer is obtained by multi-coating a plurality of thin liquid-type resists or by laminating a plurality of dry-type resists, the number of resist patterning steps increases double or more.

Besides, the alignment between the silicon substrate and a mask, with the resist layer having a thickness of 30 μm or more interposed, becomes more difficult as the thickness of the resist increases. In a worst case, the alignment becomes impossible. This problem is peculiar to the thick resist layer.

BRIEF SUMMARY OF THE INVENTION

The object of the present invention is to provide a method of precisely forming a columnar bump electrode having a height of 30 μm or more, with no an alignment error.

According to the present invention, there is provided a bump electrode structure comprising:

- a substrate having a plurality of bonding pads each having a substantially central portion and a peripheral portion surrounding the central portion;
- a core formed on the central portion of the bonding pad on the substrate, the core having a peripheral surface and an upper surface; and
- an electric conduction strip with a uniform thickness coated on the peripheral and upper surfaces of the core and electrically connected to the peripheral portion of the bonding pad, the electric conduction strip having a thickness equal to or less than a thickness of a resist layer which is formed around the core when the electric conduction strip is to be formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

FIGS. 1 to 5 illustrate steps of forming a bump electrode according to a first embodiment of the present invention.

These figures will now be referred to in succession, while the structure and the forming method of the bump electrode according to the first embodiment of the invention are described.

Figure 1:
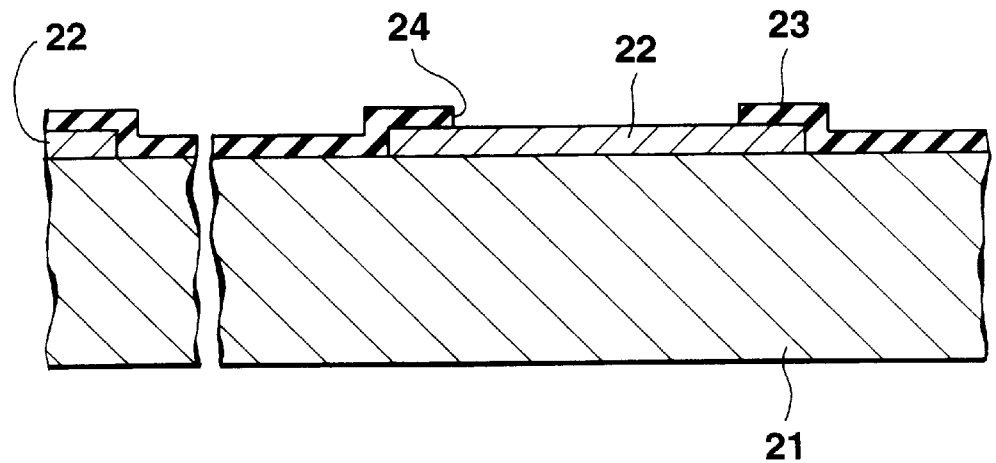
FIG. 1 is a cross-sectional view of an electrode region of a substrate which is initially prepared in order to form a bump electrode according to a first embodiment of the present invention.

As is shown in FIG. 1, a substrate 21 formed of silicon or gallium arsenide is prepared. Specifically, bonding pads 22 formed of aluminum are formed on the substrate 21. A passivation layer 23 formed of silicon oxide or silicon nitride is provided so as to cover the exposed surface of the substrate 21 and that portion of the upper surface of the bonding pad 22, which excludes a central portion of the upper surface of the bonding pad 22. The central portion of the bonding pad 22 is exposed through an opening portion 24.

Figure 2:
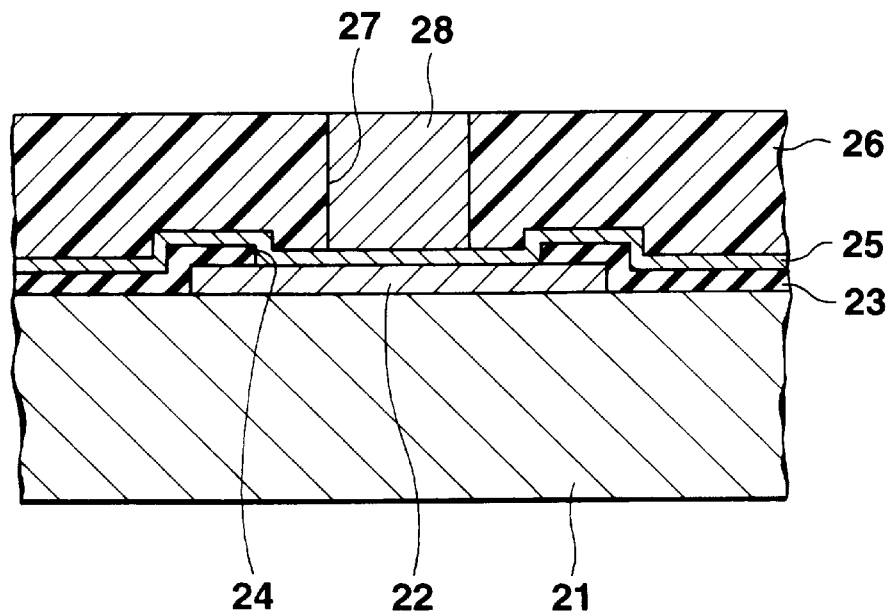
FIG. 2 is a cross-sectional view illustrating a forming step following the step shown in FIG. 1.

As is shown in FIG. 2, an under-bump metallurgy (UBM) layer 25 is formed on a major surface of the substrate 21 (on the bonding pad 22 and passivation layer 23) by means of sputtering, evaporation, etc. Then, a photosensitive resist is uniformly coated on the entire surface of the UBM layer 25 by means of a spin coating method, a roll coating method, etc. The photosensitive resist is baked to form a positive-type resist layer 26. A first predetermined mask (not shown) is used to perform exposure and development on the resist layer 26 so that a first opening portion 27 may be formed in that portion of the resist layer 26 which corresponds to the central portion of the bonding pad 22 and exposes a part of the UBM layer 25 thereon.

Figure 3:
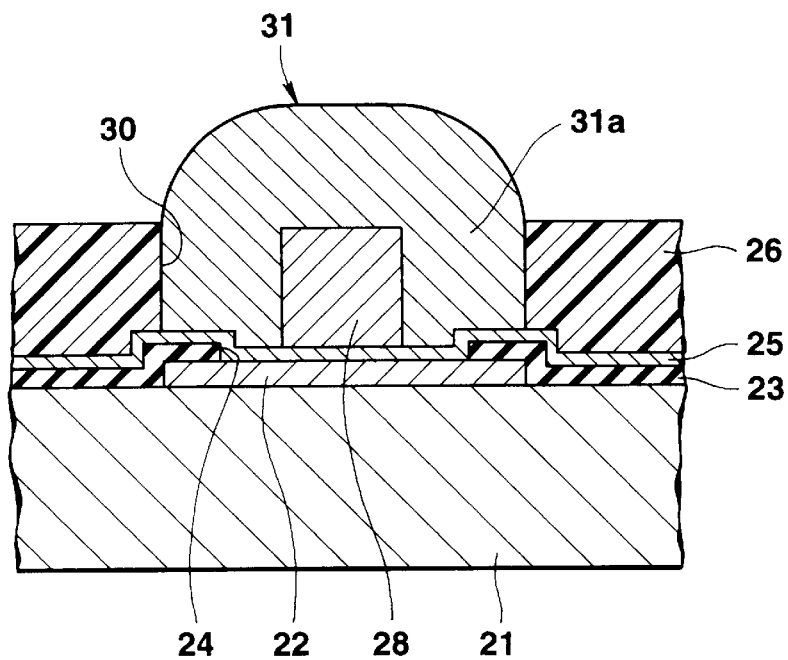
FIG. 3 is a cross-sectional view illustrating a forming step following the step shown in FIG. 2.

A core 28 is formed by electroplating in the opening portion 27 of the resist layer 26 by depositing gold to a substantially equal thickness as the resist layer 26, with the UBM layer 25 being used as a plating current path. Subsequently, as shown in FIG. 3, a second opening portion 30 is annularly formed around the core 28 by performing once again exposure and development on that portion of the resist layer 26, which lies around the core 28, by using a second predetermined mask (not shown). The second opening portion 30 has an inverted U-shaped vertical cross section, and has a width (distance between the inner periphery of the opening 30 and the outer periphery of the core 28) substantially equal to the thickness of the resist layer 26. An electric conduction strip or mass 31a formed of gold is formed by electroplating, with the UMB layer 25 used as a plating current path, on the exposed surface of the UBM layer 25 at the bottom of the second opening portion 30 in the resist layer 26 and on the exposed surface of the core 28 having the height substantially equal to the thickness of the resist layer 26. In this case, the gold or the material of the electric conduction strip 31a is isotropically deposited on the exposed surface of the core 28.

Figure 4:
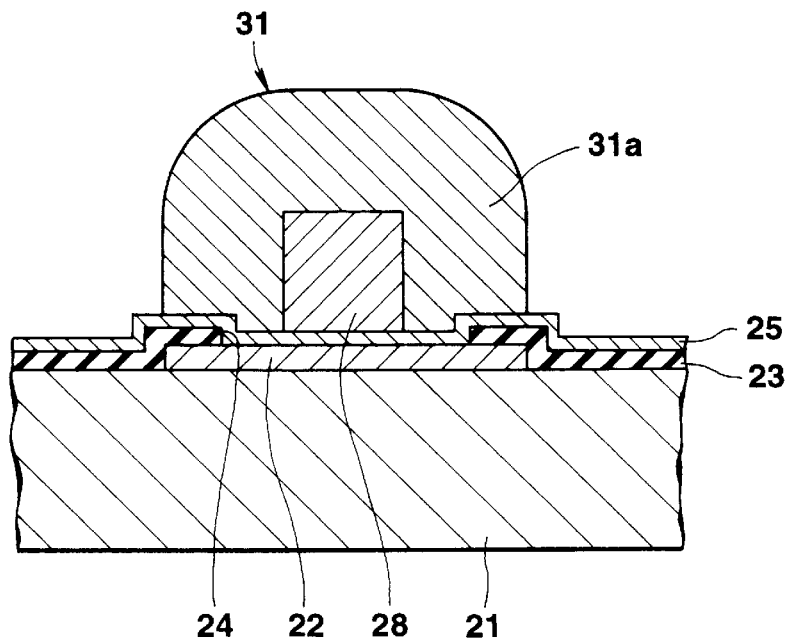
FIG. 4 is a cross-sectional view illustrating a forming step following the step shown in FIG. 3.

As a result, the core 28 having the height substantially equal to the thickness of the resist layer 26 is uniformly covered with the electric conduction strip or layer 31a having a thickness substantially equal to the thickness of the resist layer 26. Thus, the height of a bump electrode 31 comprising the electric conduction strip 31a and core 28 becomes substantially double the thickness of the resist layer 26. Thereafter, as shown in FIG. 4, the resist layer 26 is removed.

Figure 5:
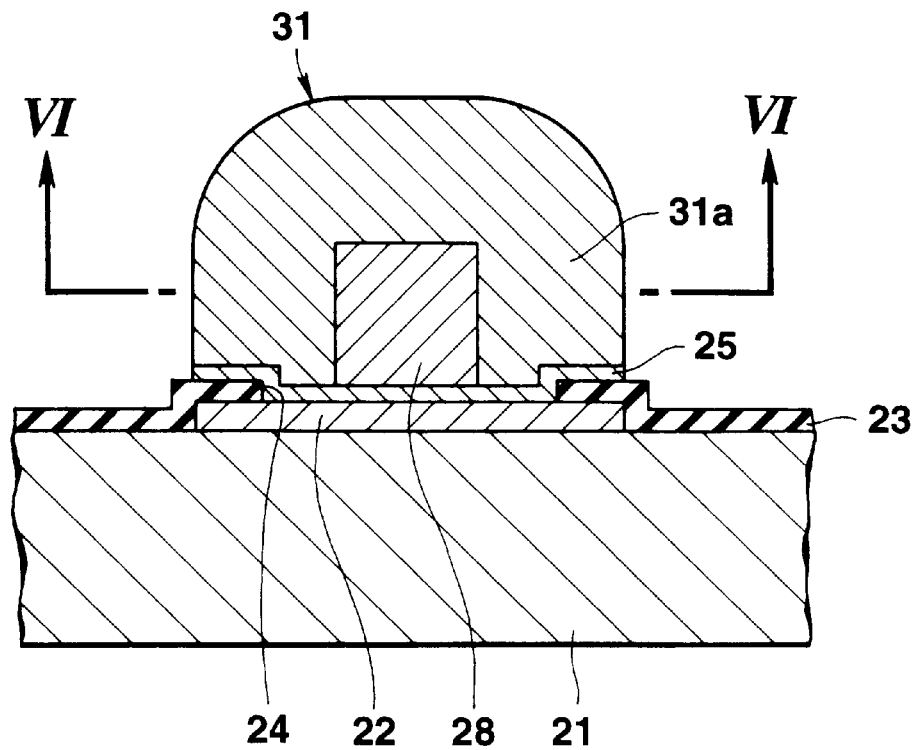
FIG. 5 a cross-sectional view illustrating a forming step following the step shown in FIG. 4.
Figure 6:
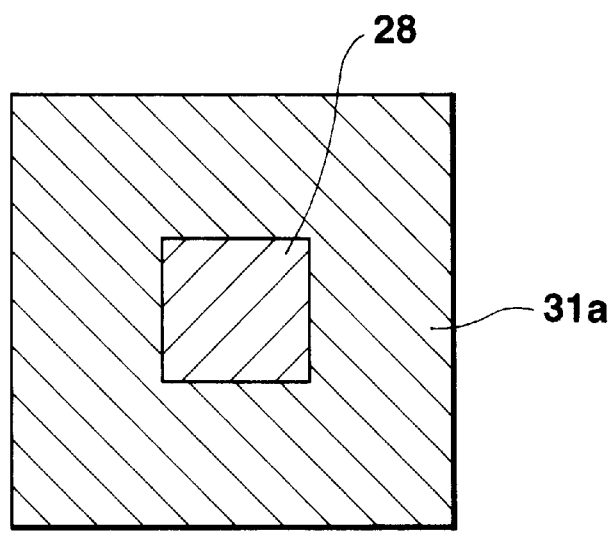
FIG. 6 is a cross-sectional view taken along line VI—VI in FIG. 5.

Subsequently, as shown in FIG. 5, the exposed portion of the UBM layer 25 is etched away by means of a dry etching method or a wet etching method, with the bump electrode 31 being used as a mask. FIG. 6 is a cross-sectional view taken along line VI—VI in FIG. 5.

Thus, the bump electrode 31, which comprises the core 28 having the height substantially equal to the thickness of the resist layer 26 and the electric conduction strip 31a covering the core 28 and having the thickness substantially equal to the thickness of the resist layer 26 and which has the height substantially equal to double the thickness of the resist layer 26, is formed on the bonding pad 22 through the UBM layer 25. Since the bump electrode 31 has a columnar shape, it does not horizontally grow from the opening portion 30 in the resist layer 26. The core 28, electric conduction strip 31a and UBM layer 25 of the bump electrode 31 are electrically connected to the bonding pad 22.

Examples of dimensions of the respective portions will now be described. Suppose, for example, that a bump electrode having a height of 60 μm is to be formed on the bonding pad 22 when the bonding pad size (each side of the pad) is 150 μm, the interval of bonding pads 22 is 50 μm, the pitch of bonding pads 22 is 200 μm, and the thickness of the resist layer is 30 μm.

Figure 14:
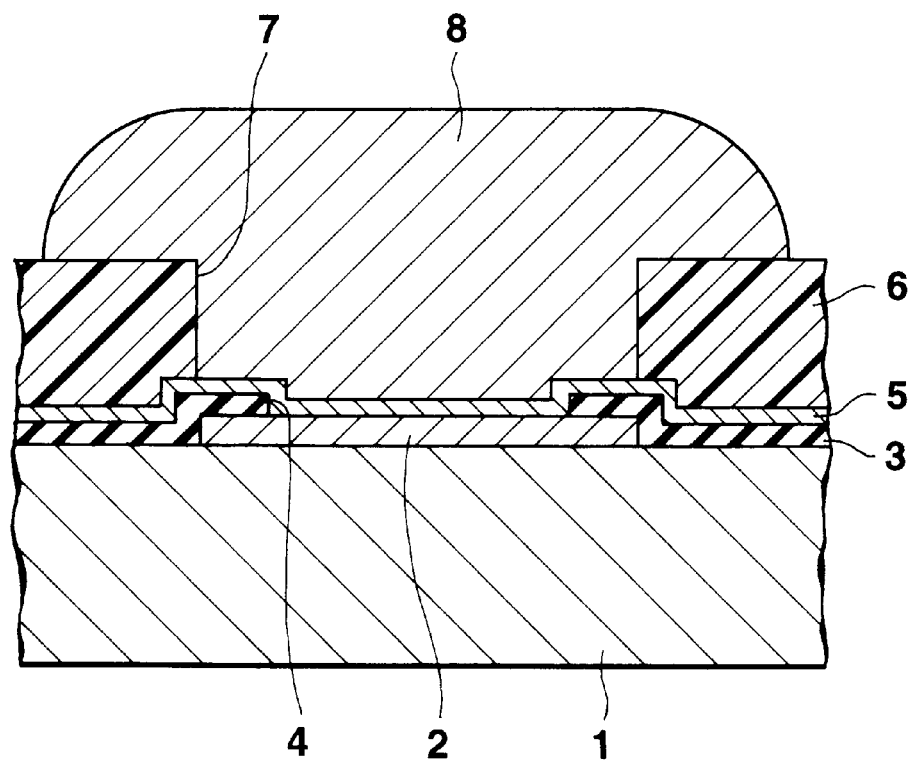
FIG. 14 is a cross-sectional view illustrating a forming step following the step shown in FIG. 13.
Figure 15:
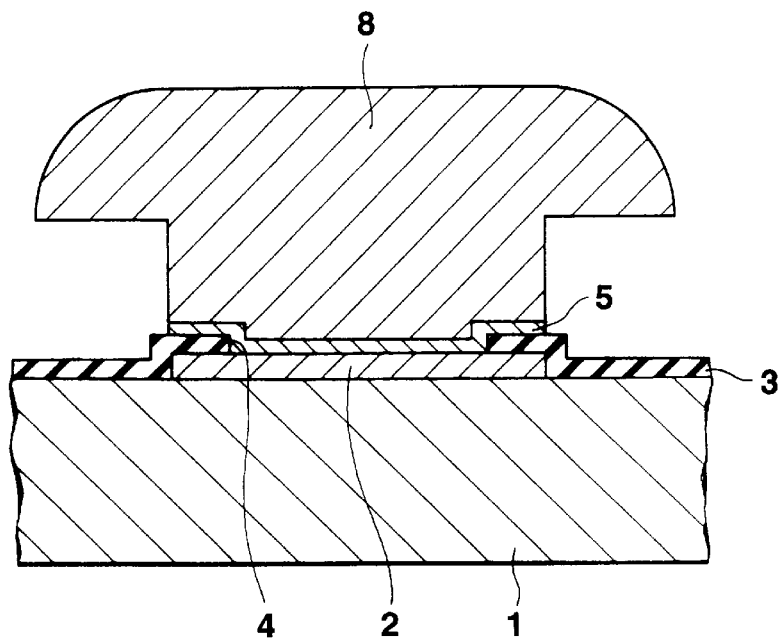
FIG. 15 is a cross-sectional view illustrating a forming step following the step shown in FIG. 14.
Figure 16:
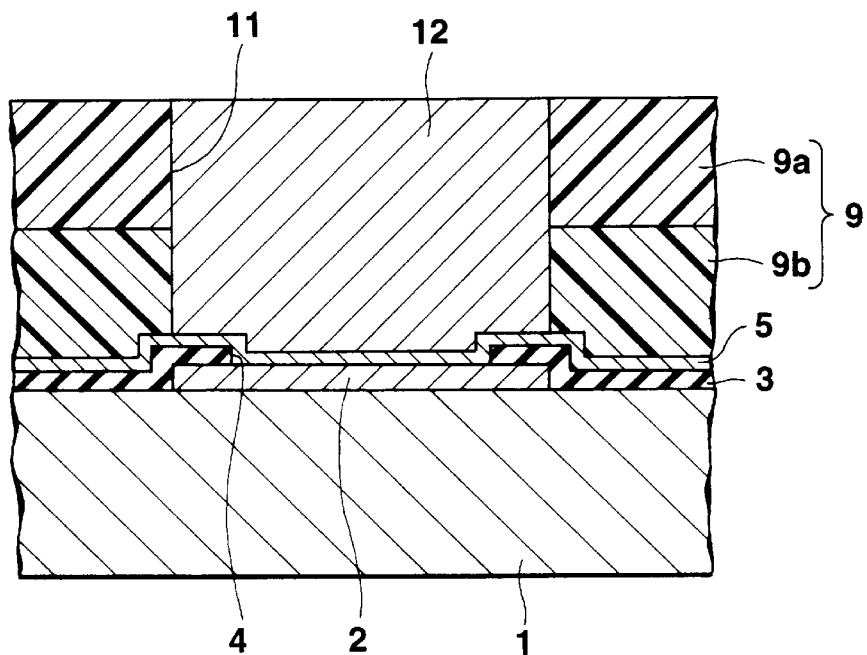
FIG. 16 is a cross-sectional view illustrating a forming step of forming another conventional bump electrode, following the step shown in FIG. 13.

In the case of the conventional bump electrode shown in FIG. 14, the precipitation by the plating method is basically isotropic. As a result, the bump electrode horizontally grows outward from the opening portion 7 of the resist layer 6 by a distance of about 30 μm at each side. Since the pitch of bonding pads 2 is 200 μm, the bump electrodes 8 are short-circuited inevitably. Inversely, if the bump electrode having a height of 60 μm is formed by this conventional method without a short-circuit, the bonding pad pitch must be increased to 260 μm or more.

On the other hand, in the case of the present invention, as shown in FIG. 3, bump electrodes each having a height of, e.g. 60 μμm can be formed on the bonding pads having the above-mentioned dimensions without a short-circuit. Therefore, according to the structure and the forming method of the bump electrodes of the present invention, the bump electrodes can be formed more finely than in the prior art.

Figure 17:
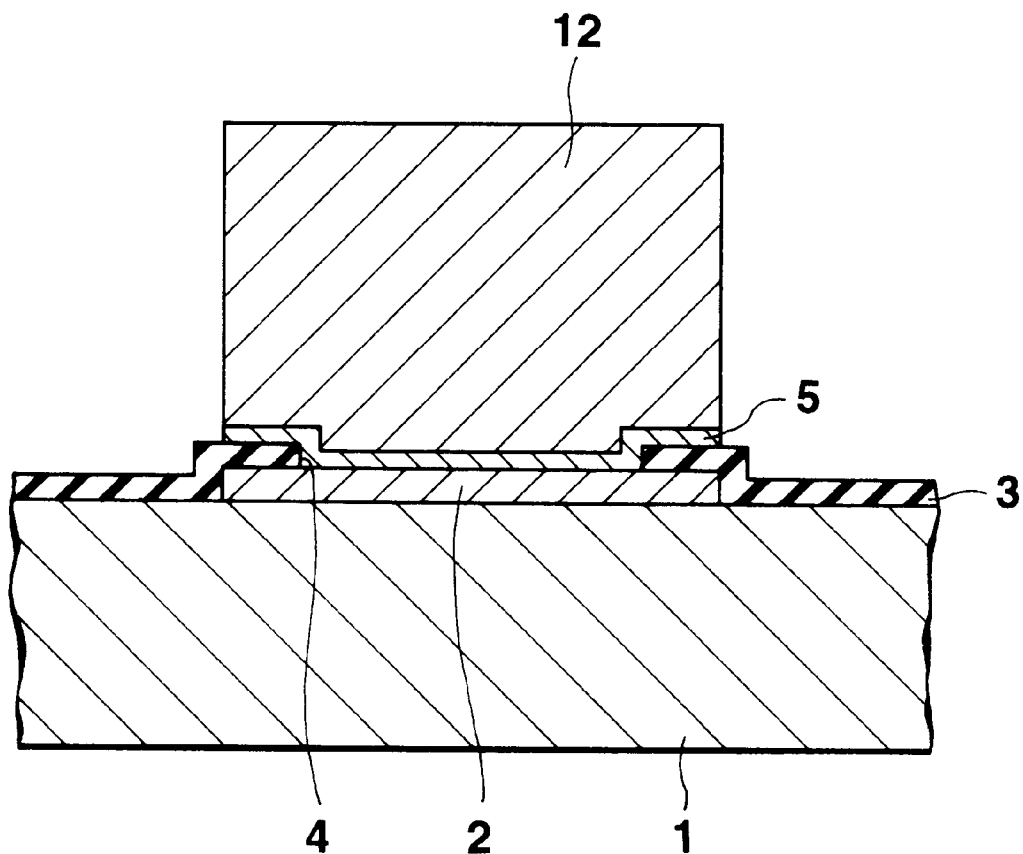
FIG. 17 is a cross-sectional view illustrating a forming step following the step shown in FIG. 16.

In addition, the bump electrode of this invention will now be compared with the other conventional bump electrode 12 shown in FIG. 17.

The bump electrode 31 according to the present invention, as shown in FIG. 3, has such a structure that the core 28 having the height substantially equal to the thickness of the resist layer 26 is covered with the electric conduction strip 31a having the thickness substantially equal to the thickness of the resist layer 26. For example, when the bump electrode having a height of, e.g. 60 μm is to be formed, it should suffice that the resist layer 26 has a thickness of 30 μm which is equal to half the height of the bump electrode.

In other words, this thickness of the resist layer can be obtained with use of a commercially available inexpensive resist. Even if the commercially available inexpensive resist is used, it is possible to form a bump electrode having the same height and shape as the bump electrode 12 formed with use of an expensive very thick resist. Therefore, the structure and forming method of the bump electrode according to the present invention have the following advantages: 1) the manufacturing cost can be reduced since the expensive very thin resist need not be used, 2) the amount of resist to be used can be reduced to half, since there is no need to form the thick resist layer, unlike the prior art (the latter example of the conventional bump shown in FIG. 17), and 3) the alignment between the substrate and the mask, between which the resist layer is interposed, can be performed easily and precisely since the resist layer to be used may be thin.

FIGS. 7 to 11 illustrate the steps of forming a bump electrode according to a second embodiment of the present invention.

The structure and the forming method of the bump electrode according to the second embodiment will now be described with reference to FIGS. 7 to 11 in succession.

Figure 7:
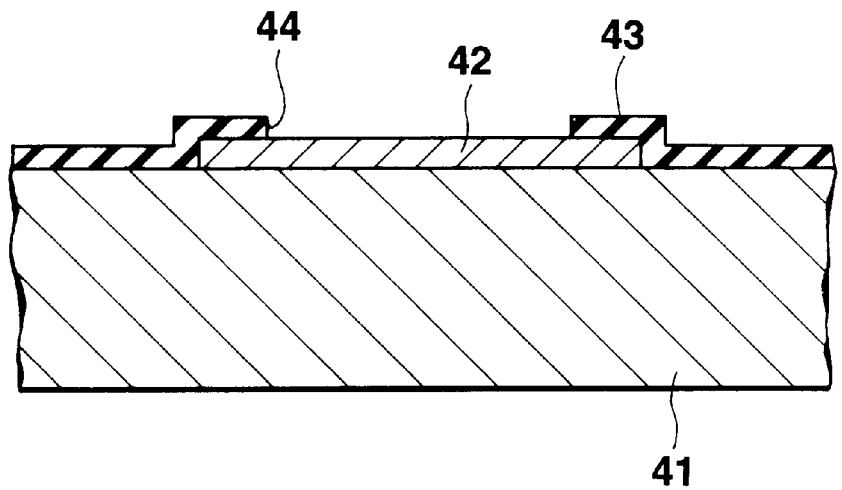
FIG. 7 is a cross-sectional view of an electrode region of a substrate which is initially prepared in order to form a bump electrode according to a second embodiment of the present invention.
Figure 8:
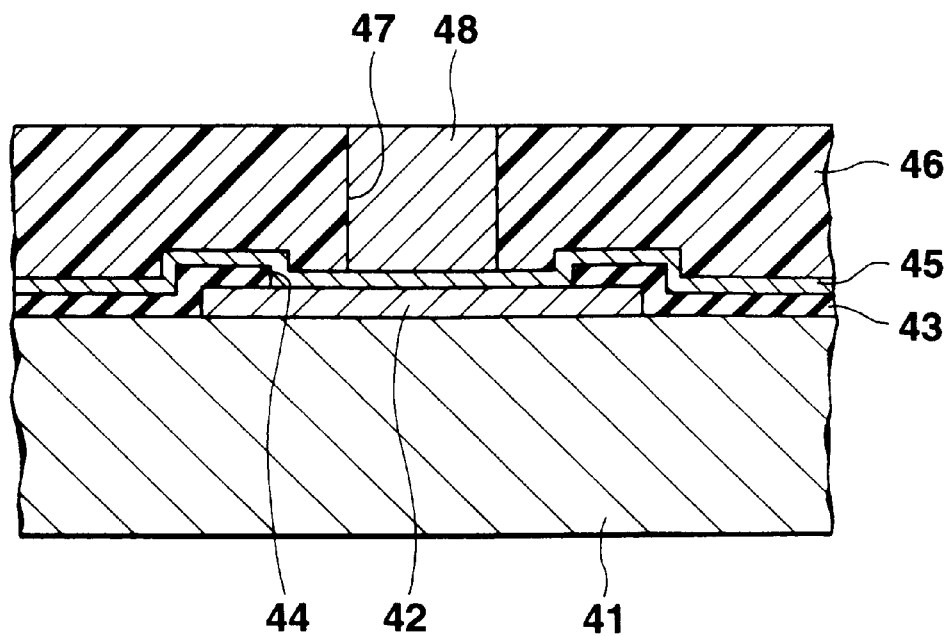
FIG. 8 is a cross-sectional view illustrating a forming step following the step shown in FIG. 7.

As is shown in FIG. 7, a substrate 41 formed of Si or GaAs is prepared. Specifically, a bonding pad 42 formed of aluminum is formed on the substrate 41. A passivation layer 43 formed of silicon oxide or silicon nitride is provided so as to cover the exposed surface of the substrate 41 and that portion of the upper surface of the bonding pad 42, which excludes a central portion of the upper surface of the bonding pad 42. The central portion of the bonding pad 42 is exposed through an opening or aperture portion 44 formed in the passivation layer 43. Then, as shown in FIG. 8, an under-bump metallurgy (UBM) layer 45 is formed on the entire surface of the resultant structure by means of sputtering, evaporation, etc.

Subsequently, a resist is uniformly coated on the entire surface of the UBM layer 45 by means of a spin coating method, a roll coating method, etc. The photosensitive resist of a negative-type is baked to form a resist layer 46. A first predetermined mask (not shown) is used to perform exposure and development on the resist layer 46 so that a first opening portion 47 may be formed in that portion of the resist layer 46 which corresponds to the central portion of the bonding pad 42.

A core 48 is formed by electroplating in the opening portion 47 of the resist layer 46 by depositing gold to a substantially equal thickness as the resist layer 46, with the UBM layer 45 being used as a plating current path.

Then, the resist layer 46 is removed, and another resist layer 46a having the same thickness as the resist layer 46 is formed on the surface of the UBM layer 45 and the entire surface of the core 48.

Figure 9:
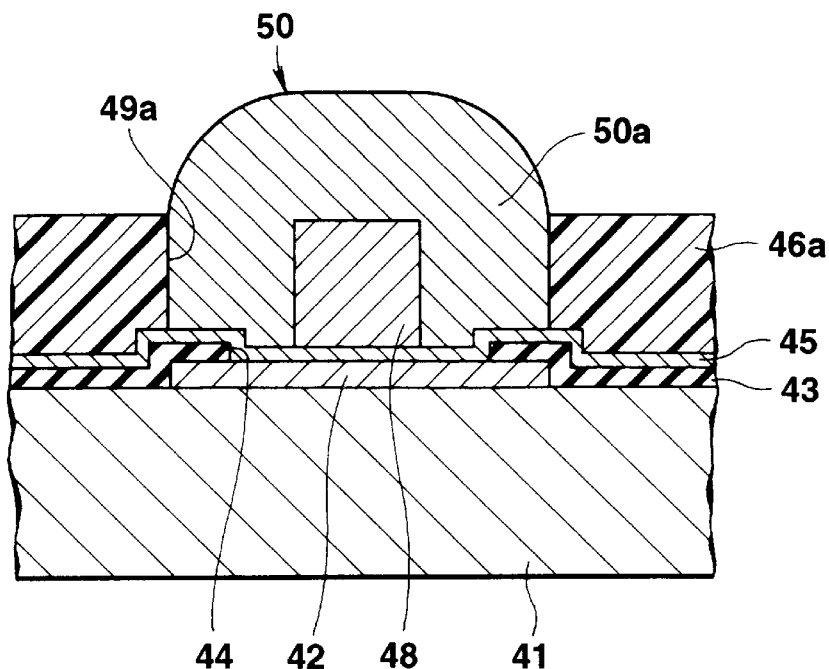
FIG. 9 is a cross-sectional view illustrating a forming step following the step shown in FIG. 8.

Subsequently, as shown in FIG. 9, a second opening portion 49a is annularly formed around the core 48 by performing exposure and development by using a second predetermined mask (not shown). The second opening portion 49a has an annular horizontal cross section, and has a width (distance between the inner periphery of the resist layer 46a and the outer periphery of the core 48) substantially equal to the thickness of the resist layer 46a.

An electric conduction strip 50a formed of gold is formed by electroplating, with the UBM layer 45 used as a plating current path, on the exposed surface of the UBM layer 45 at the bottom of the second opening portion 49a in the resist layer 46a and on the exposed surface of the core 48 having the height substantially equal to the thickness of the resist layer 46a. In this case, the gold or the material of the electric conduction strip 50a is isotropically deposited on the exposed surface of the core 48.

Figure 10:
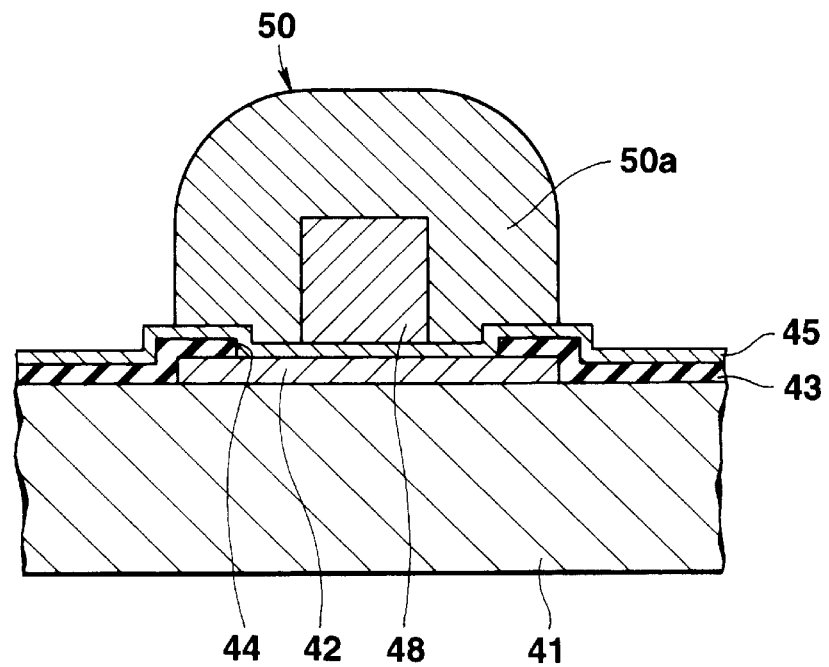
FIG. 10 is a cross-sectional view illustrating a forming step following the step shown in FIG. 9.
Figure 11:
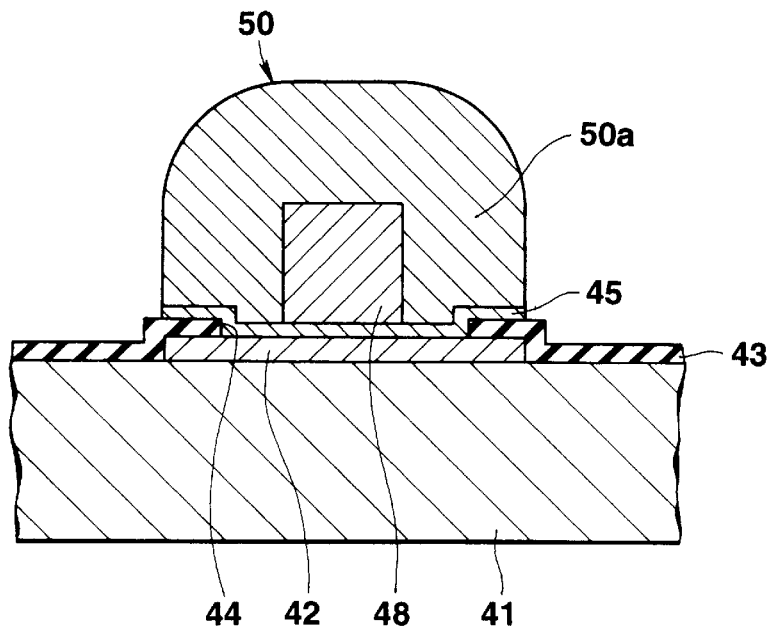
FIG. 11 is a cross-sectional view illustrating a forming step following the step shown in FIG. 10.

As a result, the core 48 having the height substantially equal to the thickness of the resist layer 46a is uniformly covered with the electric conduction strip 50a having a thickness substantially equal to the thickness of the resist layer 46a. Thus, the height of a bump electrode 50 becomes substantially double the thickness of the resist layer 46a. Thereafter, as shown in FIG. 10, the resist layer 46a is removed. Subsequently, as shown in FIG. 11, the exposed portion of the UBM layer 45 is etched away by means of a dry etching method or a wet etching method, with the bump electrode 50 being used as a mask.

Thus, the bump electrode 50, which comprises the core 48 having the height substantially equal to the thickness of the resist layer 46a and the electric conduction strip 50a covering the core 48 and having the thickness substantially equal to the thickness of the resist layer 46a and which has the height substantially equal to double the thickness of the resist layer 46a, is formed on the bonding pad 42 through the UBM layer 45.

Since the bump electrode 50 has a columnar shape, as shown in FIG, 11, it does not horizontally project from the opening portion 49a in the resist layer 46a. The core 48 and electric conduction strip 50a of the bump electrode 50 are electrically connected to the bonding pad 42 through the UBM layer 45.

In the above-described first and second embodiments of the present invention, the bump electrode comprises the core 28, 48 and the single-layer electric conduction strip 31a, 50a covering the core 28, 48.

Figure 12:
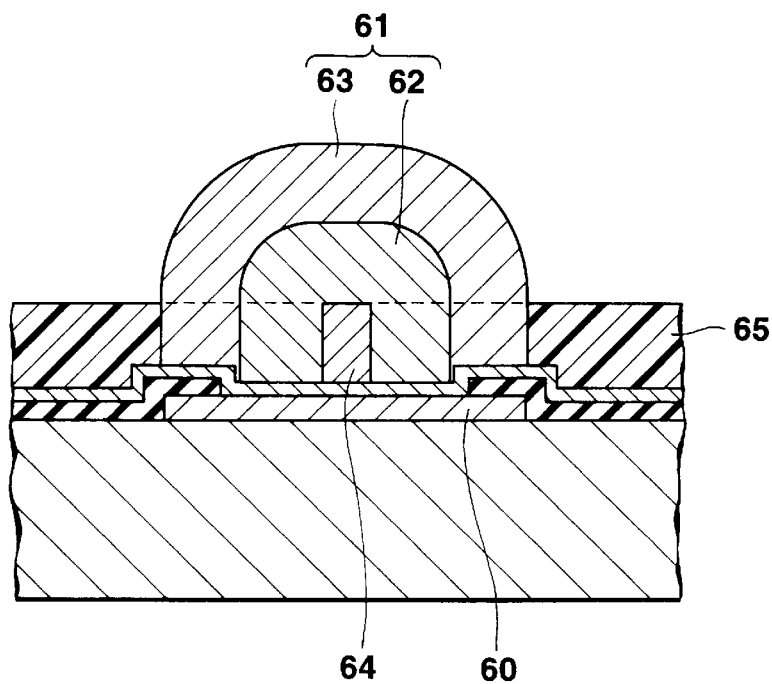
FIG. 12 is a cross-sectional view showing a bump electrode according to a third embodiment of the present invention.
Figure 13:
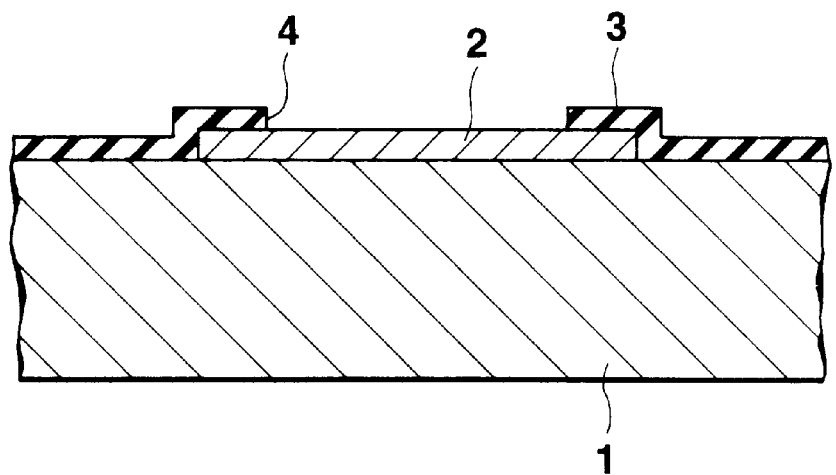
FIG. 13 is a cross-sectional view of an electrode region of a substrate which is initially prepared in order to form a conventional bump electrode.

However, for example, as shown in FIG. 12 showing a third embodiment of the invention, a bump electrode 61 may comprise a core 64 having a height substantially equal to the thickness of a resist layer 65 and two laminated layers of electric conduction strips 62 and 63 each having a thickness substantially equal to the thickness of the resist layer 65. This structure of the bump electrode can be obtained by repeating the resist patterning step and plating step in the process of forming the bump electrode according to the present invention.

Although not shown, three or more laminated electric conduction strips or layers may be provided.

Thereby, a bump electrode with the same height as those of the embodiments can be formed by using a thinner resist layer.

In the first and second embodiments of the invention, the core 28, 48 is formed of an electrically conductive material such as gold. However, the core 28, 48 may be formed of an insulating material such as polyimide resin.

In this case, the electric conduction strip 31a, 50a, 62, 63 is electrically connected to the bonding pad 22, 42, 60 through or at the UBM layers, respectively.

In the above embodiments, the core and the electric conduction strip are formed of gold. However, they may be formed of other conductive material such as one selected from the group consisting of Au, Cu, Ni, Ag, Sn, Pb, Bi, Sb, Pt, Pd, In, Fe and V, or an alloy including at least one metal in this group. Also, the under-bump metallurgy (UBM) layer may be formed of the same metal as the core, or a different metal from that of the core and the electric conduction strip.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a bump electrode comprising:

preparing a substrate having a bonding pad with a central portion and a peripheral portion surrounding the central portion;

forming a photosensitive resist on the bonding pad and over the substrate;

forming a first opening in the photosensitive resist at a portion corresponding to the central portion of the bonding pad;

forming a core in the first opening by electroplating, the core having a peripheral surface and an upper surface;

forming a second opening around the core in the photosensitive resist, the second opening having an edge which lies at a distance from the peripheral surface of the core; and forming an electric conduction strip on the peripheral surface and the upper surface of the core, and on the peripheral portion of the bonding pad by electroplating.

2. The method according to claim 1, wherein the photosensitive resist is of a positive type.

3. The method according to claim 1, wherein the step of forming a first opening includes exposing a first portion of the photosensitive resist by using a first mask, and wherein the step of forming a second opening includes exposing a second portion of the photosensitive resist by using a second mask, the second portion of the photosensitive resist having an area larger than that of the first portion of the photosensitive resist and including the entire first portion of the photosensitive resist therein.

4. The method according to claim 1, wherein the distance between the edge of the second opening of the photosensitive resist and the peripheral surface of the core is substantially equal to a thickness of the photosensitive resist.

5. The method according to claim 4, wherein the electric conduction strip has a substantially inverted U-shaped cross-section with a uniform thickness.

6. The method according to claim 1, wherein the electric conduction strip has a double-layer structure which includes a first electric conduction strip formed on the core and the bonding pad, and a second electric conduction strip formed on the first electric conduction strip and the bonding pad.

7. The method according to claim 1, wherein the core has a height substantially equal to a thickness of the photosensitive resist.

8. The method according to claim 3, wherein the photosensitive resist is of a positive type and the electric conductive strip has a substantially inverted U-shaped cross-section with a uniform thickness.

9. The method according to claim 8, wherein said substrate is formed of Si or GaAs, and said electric conductive strip is formed of a metal selected from the group consisting of Au, Cu, Ni, Ag, Sn, Pb, Bi, Sb, Pt, Pd, In, Fe and V, or is an alloy containing at least one of said metal.

10. The method according to claim 9, wherein the distance between the edge of the second opening of the photosensitive resist and the peripheral surface of the core is substantially equal to a thickness of the photosensitive resist; the electric conduction strip has a double-layer structure which includes a first electric conduction strip formed on the core and the bonding pad, and a second electric conduction strip formed on the first electric conduction strip and the bonding pad; and the core has a height substantially equal to a thickness of the photosensitive resist.

11. The method according to claim 1, wherein said substrate is formed of Si or GaAs.

12. The method according to claim 1, wherein said electric conduction strip is formed of one metal selected from the group consisting of Au, Cu, Ni, Ag, Sn, Pb, Bi, Sb, Pt, Pd, In, Fe and V, or an alloy including at least one of said metal.

* * * * *